(12) United States Patent
Lei et al.

(10) Patent No.: US 8,415,586 B2
(45) Date of Patent: Apr. 9, 2013

(54) METHOD FOR INCREASING THROUGHPUT OF SOLDER MASK REMOVAL BY MINIMIZING THE NUMBER OF CLEANING PULSES

(75) Inventors: Weisheng Lei, Portland, OR (US); Glenn Simenson, Portland, OR (US); Hisashi Matsumoto, Hillsboro, OR (US); John Davignon, Hillsboro, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 448 days.

(21) Appl. No.: 12/581,008

(22) Filed: Oct. 16, 2009

(65) Prior Publication Data

US 2010/0032417 A1 Feb. 11, 2010

Related U.S. Application Data

(62) Division of application No. 11/440,697, filed on May 24, 2006, now Pat. No. 7,605,343.

(51) Int. Cl.
*B23K 26/38* (2006.01)
(52) U.S. Cl. .................................. 219/121.69
(58) Field of Classification Search ............. 219/121.69, 219/121.71, 121.72, 121.68, 121.7; 134/1
See application file for complete search history.

(56) References Cited

U.S. PATENT DOCUMENTS

| | | | |
|---|---|---|---|
| 4,914,663 A | 4/1990 | Basu et al. | |
| 4,970,553 A | 11/1990 | Orlowski et al. | |
| 5,208,437 A | 5/1993 | Miyauchi et al. | |
| 5,593,606 A | 1/1997 | Owen et al. | |
| 5,656,186 A | 8/1997 | Mourou et al. | |
| 5,725,914 A | 3/1998 | Opower | |
| 5,742,634 A | 4/1998 | Rieger et al. | |
| 5,751,585 A | 5/1998 | Cutler et al. | |
| 5,841,099 A | 11/1998 | Owen et al. | |
| 5,864,430 A | 1/1999 | Dickey et al. | |
| 5,965,043 A | 10/1999 | Noddin et al. | |
| 5,977,512 A * | 11/1999 | Azdasht et al. | 219/121.68 |
| 6,169,014 B1 | 1/2001 | McCulloch | |
| 6,333,485 B1 | 12/2001 | Haight et al. | |
| 6,407,363 B2 | 6/2002 | Dunsky et al. | |

(Continued)

FOREIGN PATENT DOCUMENTS

| | | |
|---|---|---|
| EP | 0666504 | 9/1995 |
| JP | 2000-202664 A | 7/2000 |

(Continued)

OTHER PUBLICATIONS

Search Report and Written Opinion of Korean International Searching Authority (Oct. 31, 2007) concerning the corresponding International Pat. Appl. No. PCT/US2007/069398.

(Continued)

*Primary Examiner* — Geoffrey S Evans
(74) *Attorney, Agent, or Firm* — Stoel Rives LLP

(57) ABSTRACT

In some embodiments, laser output including at least one laser pulse having a wavelength shorter than 400 microns and having a pulsewidth shorter than 1,000 picoseconds permits the number of pulses used to clean a bottom surface of a via or the surface of a solder pad to increase process throughput. An oscillator module in cooperation with an amplification module may be used to generate the laser output.

22 Claims, 4 Drawing Sheets

U.S. PATENT DOCUMENTS

| | | | |
|---|---|---|---|
| 6,430,465 B2 | 8/2002 | Cutler | |
| 6,433,301 B1 | 8/2002 | Dunsky et al. | |
| 6,479,788 B1 | 11/2002 | Arai et al. | |
| 6,541,731 B2 | 4/2003 | Mead et al. | |
| 6,574,250 B2 | 6/2003 | Sun et al. | |
| 6,610,960 B2 | 8/2003 | De Steur et al. | |
| 6,621,040 B1 | 9/2003 | Perry et al. | |
| 6,642,478 B2 * | 11/2003 | Nishida et al. | 219/121.71 |
| 6,708,404 B1 | 3/2004 | Gaku et al. | |
| 6,727,458 B2 | 4/2004 | Smart | |
| 6,734,387 B2 | 5/2004 | Kafka et al. | |
| 6,750,422 B2 | 6/2004 | Gaku et al. | |
| 6,784,399 B2 | 8/2004 | Dunsky et al. | |
| 6,809,291 B1 | 10/2004 | Neil et al. | |
| 6,979,798 B2 | 12/2005 | Gu et al. | |
| 7,019,891 B2 | 3/2006 | Johnson | |
| 7,057,133 B2 | 6/2006 | Lei et al. | |
| 2002/0029906 A1 * | 3/2002 | Echigo et al. | 174/265 |
| 2002/0040893 A1 | 4/2002 | Arai et al. | |
| 2002/0170898 A1 | 11/2002 | Ehrmann et al. | |
| 2003/0102291 A1 * | 6/2003 | Liu et al. | 219/121.73 |
| 2003/0127500 A1 * | 7/2003 | Pierson | 228/246 |
| 2005/0175385 A1 | 8/2005 | Cho et al. | |
| 2005/0184133 A1 * | 8/2005 | Clauberg et al. | 228/203 |
| 2005/0243409 A1 * | 11/2005 | Harter et al. | 359/341.1 |
| 2005/0265408 A1 | 12/2005 | Lei et al. | |
| 2008/0296272 A1 | 12/2008 | Lei et al. | |

FOREIGN PATENT DOCUMENTS

| | | |
|---|---|---|
| JP | 2000-202679 A | 7/2000 |
| JP | 2003-260579 A | 9/2003 |
| JP | 2003-285176 A | 10/2003 |
| JP | 2004-74211 A | 3/2004 |
| JP | 2004-344961 A | 12/2004 |

OTHER PUBLICATIONS

International Preliminary Report (Nov. 27, 2008) and Written Opinion of International Searching Authority concerning the corresponding International Pat. Appl. No. PCT/US2007/069398.

Lapczyna (Ultra high repetition rate (133 MHz) laser ablation . . . of Al with 1.2ps pulses,Dec. 1999.

Machine translation of Japan Patent No. 2003-285,176, Jun. 2009.

Second Office action (Sep. 30, 2011) concerning Chinese Pat. Appl. No. 200780017817.8, which corresponds with U.S. Pat. No. 7,605,343 from which the subject application claims priority.

Office action concerning Chinese Pat. Appl. No. 200780017817.8, which corresponds with U.S. Pat. No. 7,605,343 from which the subject application claims priority, Feb. 2011.

Third Office action (Mar. 5, 2012) concerning Chinese Pat. Appl. No. 200780017817.8, which corresponds with U.S. Pat. No. 7,605,343 from which the subject application claims priority.

First Office action (Apr. 3, 2012) concerning Japanese Pat. Appl. No. 2009-512248, which corresponds with U.S. Pat. No. 7,605,343 from which the subject application claims priority.

Fourth Office action (Aug. 17, 2012) concerning Chinese Pat. Appl. No. 200780017817.8, which corresponds with U.S. Pat. No. 7,605,343 from which the subject application claims priority.

First Office action (Nov. 15, 2012) concerning Taiwan Pat. Appl. No. 096118342, which corresponds with U.S. Pat. No. 7,605,343 from which the subject application claims priority.

Fourth Office action (Dec. 4, 2012) concerning Chinese Pat. Appl. No. 200780017817.8, which corresponds with U.S. Pat. No. 7,605,343 from which the subject application claims priority.

Office action (Dec. 11, 2012) concerning Japanese Pat. Appl. No. 2009-512248, which corresponds with U.S. Pat. No. 7,605,343 from which the subject application claims priority.

* cited by examiner

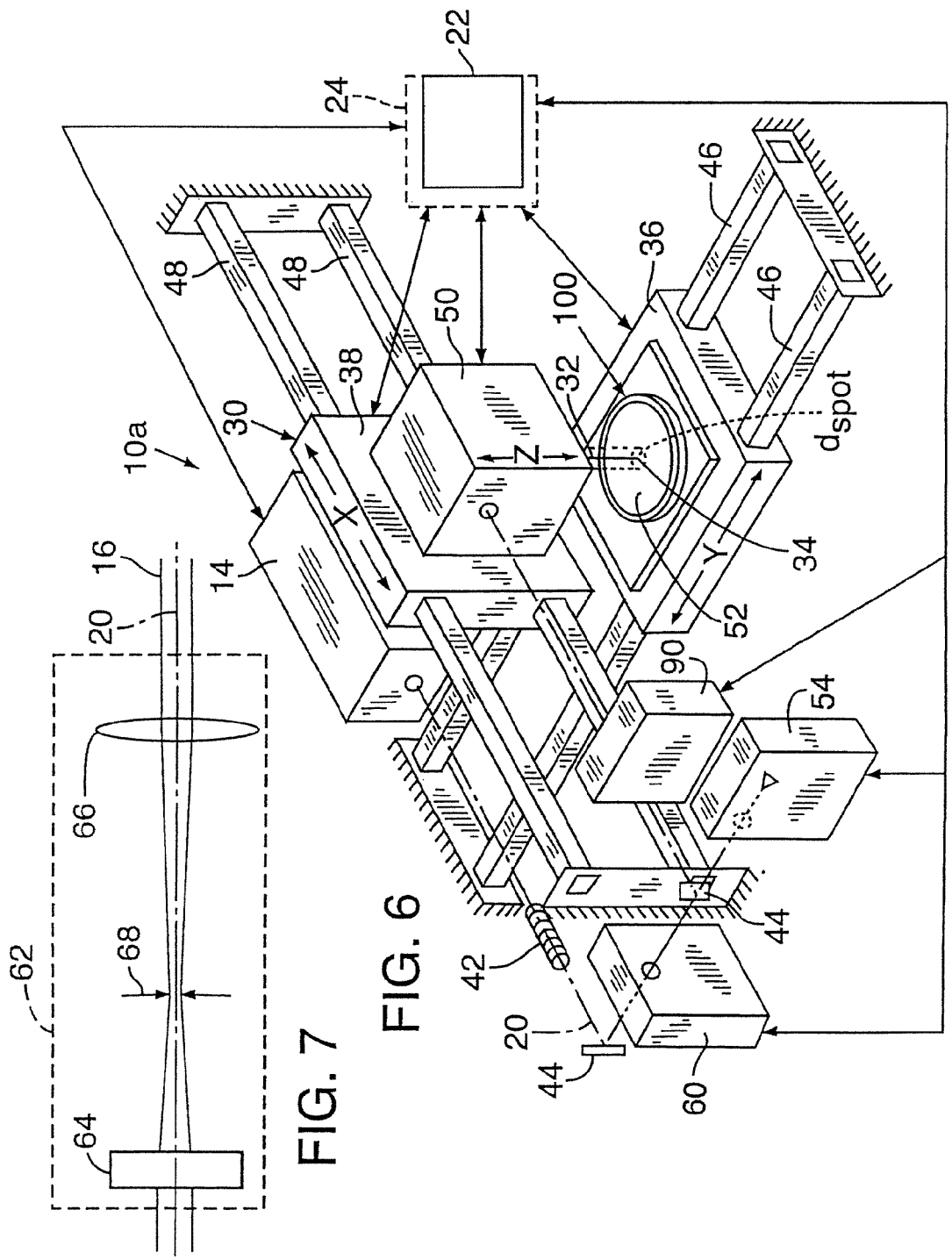

METHOD FOR INCREASING THROUGHPUT OF SOLDER MASK REMOVAL BY MINIMIZING THE NUMBER OF CLEANING PULSES

RELATED APPLICATION

This patent application is a divisional of U.S. patent application Ser. No. 11/440,697, filed May 24, 2006, which is now U.S. Pat. No. 7,605,343.

TECHNICAL FIELD

The invention relates to laser micromachining and, in particular, to laser micromachining applications with a short-pulsed laser.

BACKGROUND OF THE INVENTION

Q-switched solid-state lasers are well known and have been demonstrated successfully for many laser micromachining applications. However, micromachining parameters for Q-switched lasers, including their wavelengths (ranging from near infrared to deep ultraviolet), pulsewidths, pulse energies, and pulse repetition rates, have still not been perfected for certain classes of layered organic, inorganic, and metallic microelectronic material constructions with respect to throughput and machining quality, such as cleanness, sidewall taper, roundness, and repeatability.

One such class of materials, commonly used in the printed wiring board (PWB) industry, includes glass cloth impregnated with one or more organic polymer resins that is sandwiched between conductive metal layers, typically copper. This material configuration is known as "FR4" or "BT."

Another class, commonly used as packaging materials for high-performance integrated circuits, includes unfired, "green" ceramic materials. These ceramic substrates are formed by high-pressure pressing of powders of common ceramics such as aluminum oxide ($Al_2O_3$) or aluminum nitride (AlN). The micron- or submicron-scale particles are held together with organic "binders" that provide sufficient mechanical integrity for machining operations such as via drilling. Afterward, the green material is fired at high temperature, driving off the binders and fusing or sintering the microparticles together into an extremely strong, durable, high-temperature substrate.

U.S. Pat. Nos. 5,593,606 and 5,841,099 of Owen et al. describe techniques and advantages for employing Q-switched UV laser systems to generate laser output pulses within advantageous parameters to form through-hole or blind vias through at least two types of layers in multilayer devices, including FR4. These patents discuss these devices and the lasers and parameters for machining them. These parameters generally include nonexcimer output pulses having temporal pulsewidths of shorter than 100 nanoseconds (ns), spot areas with spot diameters of less than 100 microns (μm), and average intensities or irradiances of greater than 100 milliwatts (mW) over the spot areas at repetition rates of greater than 200 hertz (Hz).

U.S. Pat. No. 6,784,399 of Dunsky et al. discloses the use of a Q-switched carbon dioxide laser to produce bursts of laser pulses whose spikes and tails can be controlled to address disparate vaporization temperatures or melting points of the bulk via material.

U.S. Pat. No. 5,656,186 of Mourou et al. discloses a general method of laser-induced breakdown and ablation at several wavelengths by high-repetition-rate ultrafast laser pulses, typically shorter than 10 picoseconds (ps), and demonstrates creation of machined feature sizes that are smaller than the diffraction limited spot size.

U.S. Pat. No. 5,742,634 of Rieger et al. discloses a simultaneously Q-switched and mode-locked neodymium laser device with diode pumping. The laser emits a series of pulses, each having a duration time of 60 to 300 ps, under a time duration of 100 ns.

U.S. Pat. No. 6,574,250 of Sun et al. is the first to disclose a method for processing links on-the-fly with at least two laser pulses. One embodiment employs pulses having pulsewidths shorter than 25 picoseconds (ps).

U.S. Pat. No. 6,734,387 of Kafka et al. discloses the use of UV picosecond laser output from a mode-locked, quasi-continuous wave (cw) laser system to cut or scribe lines in polymeric films.

SUMMARY OF THE INVENTION

An object of the present invention is, therefore, to provide a laser and/or method to increase throughput for laser micromachining of microelectronic manufacturing materials.

Some preferred embodiments concern via drilling and/or ablation of electronic materials such as homogeneous films, particulate-filled resins, polyimides, and fiber-reinforced polymers, with or without metal cladding, using a picosecond pulsewidth solid-state UV laser.

Some preferred embodiments concern the machining of green ceramics, solder pad cleaning, or removal of photoresist material.

In some exemplary embodiments, the number of pulses employed to clean an underlying pad is significantly reduced, and in most preferred cases only one pulse is employed for cleaning.

In some embodiments, the laser output is generated by an oscillator module in cooperation with an amplification module. In some preferred embodiments, the oscillator module comprises a diode-pumped, solid-state (DPSS) master oscillator. In some preferred embodiments, the oscillator module comprises a pulsed semiconductor laser emitting picosecond pulses. In some embodiments, the oscillator module comprises a pulsed fiber master oscillator. In some preferred embodiments, the pulsed fiber master oscillator comprises a diode-pumped, rare-earth-doped glass fiber master oscillator employing a semiconductor saturable-absorbing mirror (SESAM). In some embodiments, the glass fiber master oscillator comprises a rare-earth-doped, fused silica fiber. The rare-earth dopants preferably comprise Nd, Yb, Ho, Er, Dy, Pr, Tm, or Cr.

In some preferred embodiments, the amplification module comprises a single-pass, multipass, or regenerative DPSS amplifier. In some embodiments, the amplification module comprises an $Nd:GdVO_4$, $Nd:YVO_4$, Nd:YLF, Nd:glass, or Nd:YAG gain medium. In some embodiments, the amplification module comprises a rare-earth-doped glass fiber power amplifier. In some embodiments, the rare-earth-doped glass fiber power amplifier comprises a rare-earth-doped fused silica fiber power amplifier. The rare-earth dopants are preferably selected from Nd, Yb, Ho, Er, Dy, Pr, Tm, and Cr.

In some exemplary embodiments, imaged UV laser output having one or more pulses shorter than 1,000 ps is employed to perform the pad-cleaning process.

In some embodiments, the laser output comprises multiple independently triggered pulses or bursts of pulses selected from a pulse train emitted from the amplification module.

Additional objects and advantages of the present invention will be apparent from the following detailed description of preferred embodiments thereof, which proceeds with reference to the accompanying drawings.

BRIEF DESCRIPTION OF THE DRAWINGS

FIG. 6 is a simplified partly pictorial and partly schematic diagram of the laser system of FIG. 5, showing some components of an exemplary beam-positioning system.

FIG. 7 is a simplified pictorial diagram of an optional imaged optics module that may be used in an exemplary laser system.

DETAILED DESCRIPTION OF PREFERRED EMBODIMENTS

Figure 1:
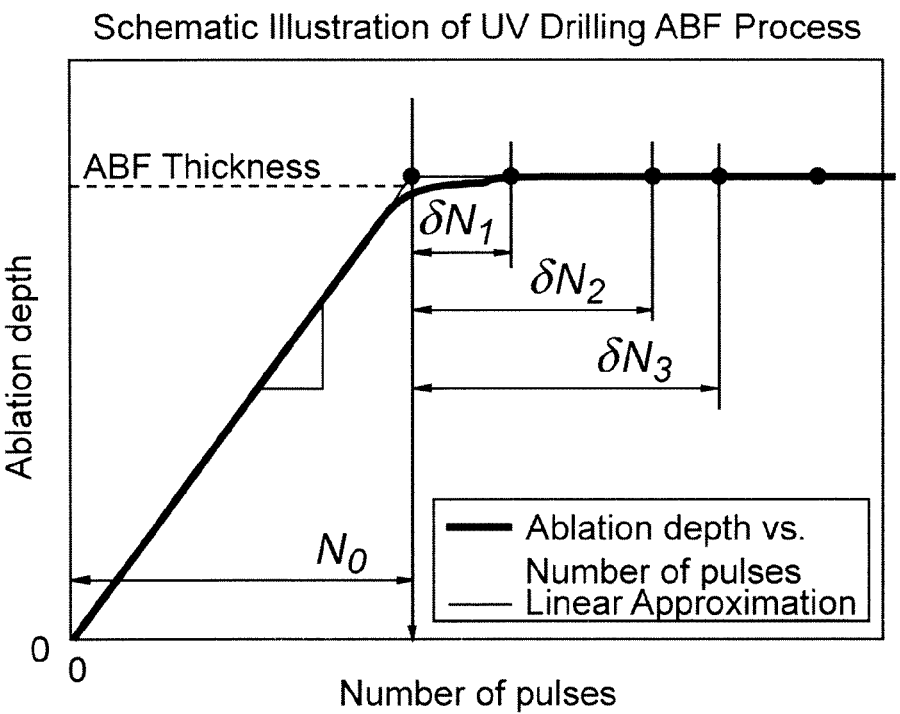
FIG. 1 is a graphical representation of ablation depth versus number of pulses for an exemplary via drilling.

Preferred embodiments entail the use of a solid-state UV laser to perform via drilling and ablation of electronic circuit materials such as homogenous films, particulate-filled resins, polyimides, and fiber-reinforced polymers, with or without metal cladding. An Ajinomoto build-up film (ABF®) circuit-board dielectric material manufactured by Ajinomoto Fine-Techno Co., Inc., Kawasaki, Japan, is typical of a target material upon which via drilling operations may be performed. Some exemplary workpieces include ABF® SH-9K, ABF® GX-3, ABF® GX-13, or similar products manufactured by other companies, but other via drilling target materials (including, but not limited to, multilayered, laminated substrates such as those used in high-density printed wiring boards and integrated circuit chip packages are also suitable for processing in accordance with the exemplary embodiments disclosed herein.

Workpieces intended for via drilling typically contain conductive cladding layers that may be positioned on the top or bottom surfaces of the workpiece. These layers may contain, for example, standard metals such as aluminum, copper, gold, molybdenum, nickel, palladium, platinum, silver, titanium, tungsten, metal nitrides, or combinations thereof. Conventional metal layers vary in thickness, typically between 5 and 36 μm (where $7.8 \times 10^{-3}$ kg of metal equals a thickness of about 9 μm), but may be thinner, or as thick as 72 μm. The top and bottom conductive layers are typically made of the same material.

A dielectric matrix or layer positioned between the conductive layers may contain a standard organic dielectric material such as benzocyclobutane (BCB), bismaleimide triazine (BT), cardboard, cyanate esters, epoxies, phenolics, polyimides, polytetrafluorethylene (PTFE), various polymer alloys, or combinations thereof. Conventional organic dielectric layers vary considerably in thickness, but are typically much thicker than the conductive layers. An exemplary thickness range for the organic dielectric layers is about 30 to 400 μm.

The dielectric layer may also contain a standard reinforcement component that may be fiber matte or dispersed particles of, for example, aramid fibers, ceramics, or glass woven or dispersed throughout the organic dielectric layer and that may comprise much of its thickness. Conventional reinforcement components are typically individual filaments or particles of about 1 to 10 μm and/or woven bundles of 10 μm to several hundreds of microns. Skilled persons will appreciate that the reinforcement components may be introduced as powders into the organic dielectrics and can be noncontiguous and nonuniform. Such composite or reinforced dielectric layers typically require laser processing at a higher fluence than is needed to ablate unreinforced layers, but some particle-filled resins can be processed at a fluence similar to unreinforced layers.

Some exemplary embodiments pertain to drilling blind vias, and particularly drilling blind vias in homogeneous or filled resins. Such blind via drilling is commonly done with a punching process, wherein sequential laser pulses are directed at a single target position on a workpiece until a desired depth is achieved such that the bottom copper layer is exposed.

In blind via drilling and analogous laser machining processes, a total number of pulses N employed to form a qualified via includes a bulk number $N_0$ of bulk removal pulses for bulk material removal and a bottom surface cleaning number δN of cleaning pulses employed for cleaning off the bottom (metal) surface or pad of the via. The number of pulses to clean a bottom metal pad can take the significant portion of the total number of pulses required to drill the blind via if the laser pulsewidth is as long as several tens of nanoseconds. The bulk material removal and the bottom cleaning involve different laser/material interaction mechanisms. So one efficient way to reduce the via drilling time would be to reduce the bottom surface cleaning number δN of pulses used for bottom metal pad cleaning by adjusting laser parameters while somehow not adversely affecting the bulk material removal process.

FIG. 1 is a graphical representation of ablation depth versus number of pulses for an exemplary via drilling punching process using an imaged UV beam such that the total number of pulses N is partitioned into the bulk number $N_0$ of bulk removal pulses and the bottom surface cleaning number δN of cleaning pulses. FIG. 1 shows that depending on the applications and the solid-state UV laser sources being used, the cleaning number δN of pulses for bottom pad cleaning can be significantly different as $\delta N_1$, $\delta N_2$, $\delta N_3$, etc. For some applications, the ratio of δN to $N_0$ can be more than 1, meaning that more time is spent cleaning the bottom pad than for bulk material removal. So it is desirable to reduce δN in order to reduce the total drilling time per via. It is also desirable to reduce δN in order to reduce the amount of energy dumped into a pad to avoid unnecessary thermal damage.

Conventional methods of controlling a via drilling process entail controlling the pulse energy for the given process. The pulse energy, $E_P$, for use in performing a given process is determined by the fluence, F, desired for the process. The fluence, in $J/cm^2$, is calculated as $$F = \frac{E_P}{\frac{\pi}{4}D^2}, \quad (1)$$

where $E_P$ is the pulse energy in J and D is the beam spot diameter in cm. Applicants have found that drilling the same material at the same fluence level with lasers having different pulsewidths results in different quality for the bottom copper cladding layer of a target specimen. Applicants have determined that a more appropriate parameter for predicting the bottom copper cladding quality for blind vias is $$\frac{F}{\sqrt{\tau}},$$

where F is the pulse fluence in J/cm² and r is the laser pulsewidth in nanoseconds.

In view of the foregoing, applicants have developed a model to quantify the number of pulses used for pad cleaning that depends on a parameter L, which is a function of the laser pulse repetition rate $f$ and the laser pulsewidth $\tau$. Some relationships between $\delta N$, $F/\sqrt{\tau}$, and L can be expressed as $$L = L(f, \tau) = \sqrt{\frac{1}{f \cdot \tau}} - \sqrt{\frac{1}{f \cdot \tau} - 1}, \quad (2)$$

$$L \cdot (\delta N - 1) \approx \frac{1}{C_1} \cdot \left( \frac{T_m - T_0}{F/\sqrt{\tau}} - C_2 \right), \quad (3)$$

where $C_1$ and $C_2$ are coefficients related to metal (pad) properties (such as optical, thermal, and/or mechanical properties) and where $T_m$ and $T_0$ are the melting temperature and the initial temperature of metal pad.

Figure 2:
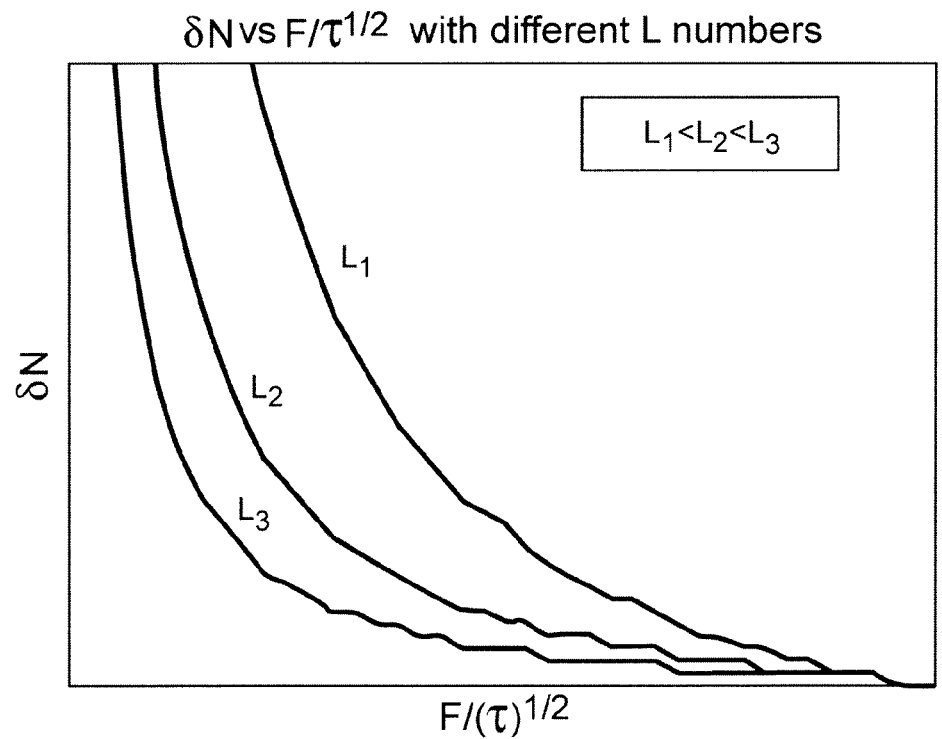
FIG. 2 is a graphical representation of δN versus $F/\sqrt{\tau}$ for different values of the parameter L.

FIG. 2 is a graphical representation of $\delta N$ versus $F/\sqrt{\tau}$ for different values of the parameter L for an exemplary via drilling punching process using an imaged UV beam. FIG. 2 shows that when the term $F/\sqrt{\tau}$ is large enough, $\delta N$ can be minimized to 1.

Based on the foregoing revelations, $\delta N$ can be predicted for different laser parameters. For example, a solid-state UV laser, having available laser power of 1.35 watts at the work surface at 50 kilohertz (kHz) to drill a via having a beam diameter of 58 µm, provides a fluence at the work surface of 1.02 J/cm². At a nanosecond pulsewidth such as $\tau$=75 ns, $F/\sqrt{\tau}$=0.12 J/cm² ns$^{-1/2}$ and L=0.030647, so $\delta N$=20. However, at a picosecond pulsewidth such as $\tau$=10 ps, $F/\sqrt{\tau}$=10.22 J/cm² ns$^{-1/2}$ and L=0.000354; so, at this condition, one can be almost certain that $\delta N$=1.

These examples illustrate the improved efficiency in the via drilling process that can be obtained by using a picosecond pulsewidth solid-state UV laser. A solid-state UV laser, having laser output in the picosecond pulsewidth regime (from 1 ps to 1,000 ps), can allow for such an exemplary $\delta N$=1 process by creating steeper temperature gradients at the interface of the bulk material and the target pad material of the via, resulting in more efficient cleaning of the last remaining material on the target pad. The lower energy put into the target pad decreases the chances of thermal damage for small isolated target pads, which are not directly attached to a circuit trace and therefore cannot dispense of excess energy through a circuit trace. While some preferred embodiments employ UV laser pulses having a pulsewidth shorter than 1,000 ps, some embodiments employ UV laser pulses having a pulsewidth shorter than 500 ps, and some embodiments employ UV laser pulses having a pulsewidth shorter than 100 ps. Pulsewidths shorter than 1 ps and particularly in the femtosecond regime may also be employed.

In addition to the bulk material removal and pad cleaning embodiments presented above, another process of particular interest is via drilling in FR4 and BT resins, either blind vias or through-holes. FR4 may be difficult to laser-machine for several reasons. First, the material is highly heterogeneous, particularly with respect to properties governing laser ablation characteristics such as melting and vaporization temperatures. Specifically, the vaporization temperatures of the woven glass reinforcement and the polymer resin matrix differ greatly. Pure silicon dioxide has melting and vaporization temperatures of 1,970 Kelvin (K) and 2,503 K, respectively, while typical organic resins such as epoxies vaporize at much lower temperatures, on the order of 500 to 700 K. This disparity makes it difficult to laser-ablate the glass component while avoiding ablation of too much of the resin surrounding individual glass fibers or in regions directly adjacent to fiber bundles.

Most FR4 glass cloth is also woven from bundles or "yarns" of individual glass filaments. Filaments are typically 4 to 7 µm in diameter, and yarns range from about 50 µm to several hundred microns in diameter. The yarns are generally woven in an open-weave pattern, resulting in areas of high glass density where yarns cross each other and areas of low or zero glass density, such as between adjacent bundles. Because the locations of vias cannot be selected a priori with respect to the weave pattern, the desirable via locations will vary with glass density. Thus laser micromachining process parameters that work equally well in both high- and low-glass-density regions of the substrate are desirable. Process conditions that are "aggressive" enough to cleanly vaporize all the glass in high-density regions and at the same time are "mild" enough to avoid over-etching or removing too much resin or causing excessive pad damage in low-density regions have been difficult to achieve with most conventional laser processes.

Figure 3A:
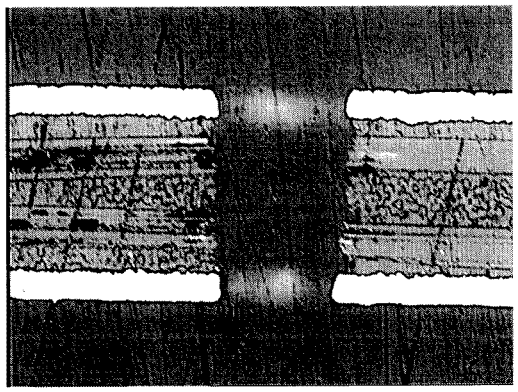
FIGS. 3A and 3B are optical micrographs that show cross sections of vias drilled in woven reinforced resin that exhibit respective small and large heat-affected zones.
Figure 3B:
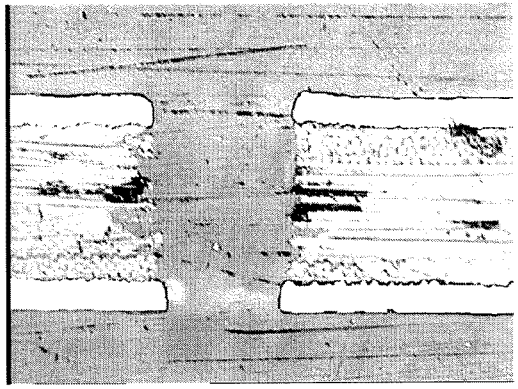

For via drilling in woven reinforced resins, the picosecond pulsewidth solid-state UV laser can process the material with a smaller heat-affected zone and result in vias with better sidewall quality. FIGS. 3A and 3B show cross sections of through-hole vias drilled in woven reinforced resin that exhibit respective small and large heat-affected zones. Vias drilled with picosecond pulsewidth parameters may exhibit the smaller heat-affected zone similar to that shown in FIG. 3A and have less fiber protrusion on the sidewall of the via. This quality would be expected when drilling both blind vias and through-holes in this material in the picosecond pulsewidth regime. The increased fiber protrusion exhibited in FIG. 3B can be a consequence of a large heat-affected zone such as may be produced by parameters employing a tens of nanosecond pulsewidth regime.

For woven reinforced resin blind vias and through-hole via drilling, the picosecond pulsewidth solid-state UV laser process can decrease the thermal diffusion of heat into the sidewalls of the via and result in improved via sidewall quality. Similarly, for via drilling through materials with a top metal layer, the picosecond pulsewidth solid-state UV laser can decrease the thermal diffusion of heat into the metal layer and result in better quality cutting and less chance of thermal damage to the metal layer, especially for thin metal layers.

While some embodiments and examples are directed to via drilling, the techniques are also applicable to other applications of material removal, such as the machining of green ceramics, solder pad cleaning, or removal of photoresist material.

Laser machining green ceramics poses concerns similar to those for processing FR4 due to the differences in the thermal properties of the organic binders and the ceramic microparticles. The disparity between the vaporization temperature of the binder (again, on the order of 500 K) and the ceramic (3,800 K for $Al_2O_3$) influences the way material is removed during laser drilling. Because ceramic has a high vaporization temperature, it is quite difficult to remove green ceramic through direct melting (at 2,340 K for $Al_2O_3$) or vaporization of the microparticles.

The preferred laser micromachining process instead relies upon the explosive vaporization of the binder material holding the microparticles together. When exposed to laser pulses, the binder vaporizes much more easily than the ceramic, and the organic vapor is driven to a high temperature at extremely high heating rates, creating localized high-pressure gas regions in the spaces between microparticles. The high-pressure gas then expands rapidly, disintegrating the green ceramic material. Thus the green ceramic material can be removed while in its solid state with each laser pulse, at removal rates much higher than could be obtained by its direct vaporization.

Material removal by explosive vaporization of the binder can be either advantageous or disadvantageous in laser micromachining green ceramics. If the organic vapor pressure is too high or spread across too wide an area, undesirable effects such as chipping or microcracking can occur. If the high-pressure regions are too localized or not hot enough, poor material-removal rates will result. The picosecond pulsewidth solid-state UV laser can decrease the thermal diffusion of heat into the sidewalls of the via and result in improved via sidewall quality in green ceramic materials.

With reference once again to embodiments concerning both blind via drilling and ablation of protective polymer coverings, another significant concern is that isolated pads may get lifted if the pad absorbs too much laser energy, which disqualifies the process and the via so formed. Conventional processes are particularly vulnerable to this pad lifting effect, as the sizes of the features are reduced relative to the size of the beam doing the ablation. For these smaller features, such as pads having a diameter less than twice the drilled via diameter and a thickness of typically less than about 18 µm, it is particularly desirable to reduce the number $\delta N$ of pad-cleaning pulses after the bulk material is removed in order to minimize the energy dumped into the pad. This pad lifting effect is expected to become an even greater concern as feature sizes continue to shrink in the future.

Figure 4A:
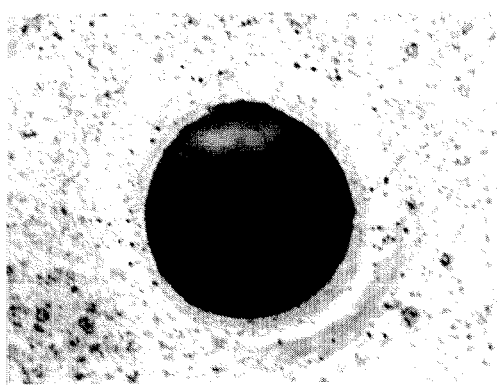
FIGS. 4A and 4B are optical micrographs showing the results of processes to remove solder mask from pads that are approximately the same size as the laser beam being used to remove the solder mask.
Figure 4B:
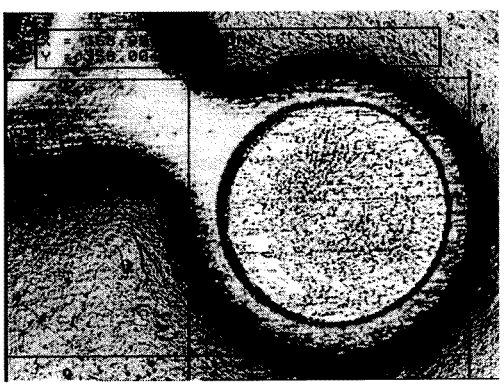

FIGS. 4A and 4B are optical micrographs showing the results of processes to remove solder mask from pads that are approximately the same size as the laser beam being used to remove the solder mask. Solder mask is typically removed through time-consuming lithographic processes that may suffer from alignment constraints or through chemical etching processes, and can be difficult to process with typical solid-state laser techniques.

There are two types of solder mask materials: liquid photoimageable solder mask (LPISM) and dry film solder mask (DFSM). Typical available liquid photoimageable solder mask (LPISM) include, but are not limited to: Coates ImageCure® XV501T & XV501TSM, Coates ImageFlex™ (Flexible Solder Mask) SV 601T, Enthone Enplate® DSR 3241 and DSR 3241 GM, Rogers Rflex® 8080 LP1 and Rflex® 8080 LP3 (flexible), Taiyo PSR 4000 BN and 4000 AUS5, Taiyo PSR 9000 (Flexible), or Vantico Probimer® 77 LPI Solder Mask. Typical available dry film solder mask (DFSM) include, but are not limited to: Dupont™ VACREL®8100, Dupont™ Flexible Photoimageable Coverlay (PIC) 1000 and 2000, Shipley (Dynachem) DynaMASK® 5000, or Shipley ConforMASK® 2500.

The pad of the workpiece shown in FIG. 4A received too much energy during processing and delaminated from the panel. The pad of the workpiece shown in FIG. 4B did not receive excessive energy from the process, so delamination did not occur and the results are acceptable. By having a steeper temperature gradient at the pad with a picosecond pulsewidth solid-state UV laser and a $\delta N=1$ process, the amount of energy put into the pad during processing can be reduced and the chance of pad delamination is reduced.

In addition to removal of solder mask material, the UV picosecond laser machining technique can be employed to remove any resist material with or without photosensitizers. Conventional photoresist materials generally comprise positive photoresists that become soluble where exposed to light and negative photoresists that become polymerized (insoluble) where exposed to light. Photoresist materials include, but are not limited to, Novolak (M Cresol formaldehyde) or an etch-resistant poly coating, such as polyisoprene or polymethylisopropenyl ketone.

Figure 5:
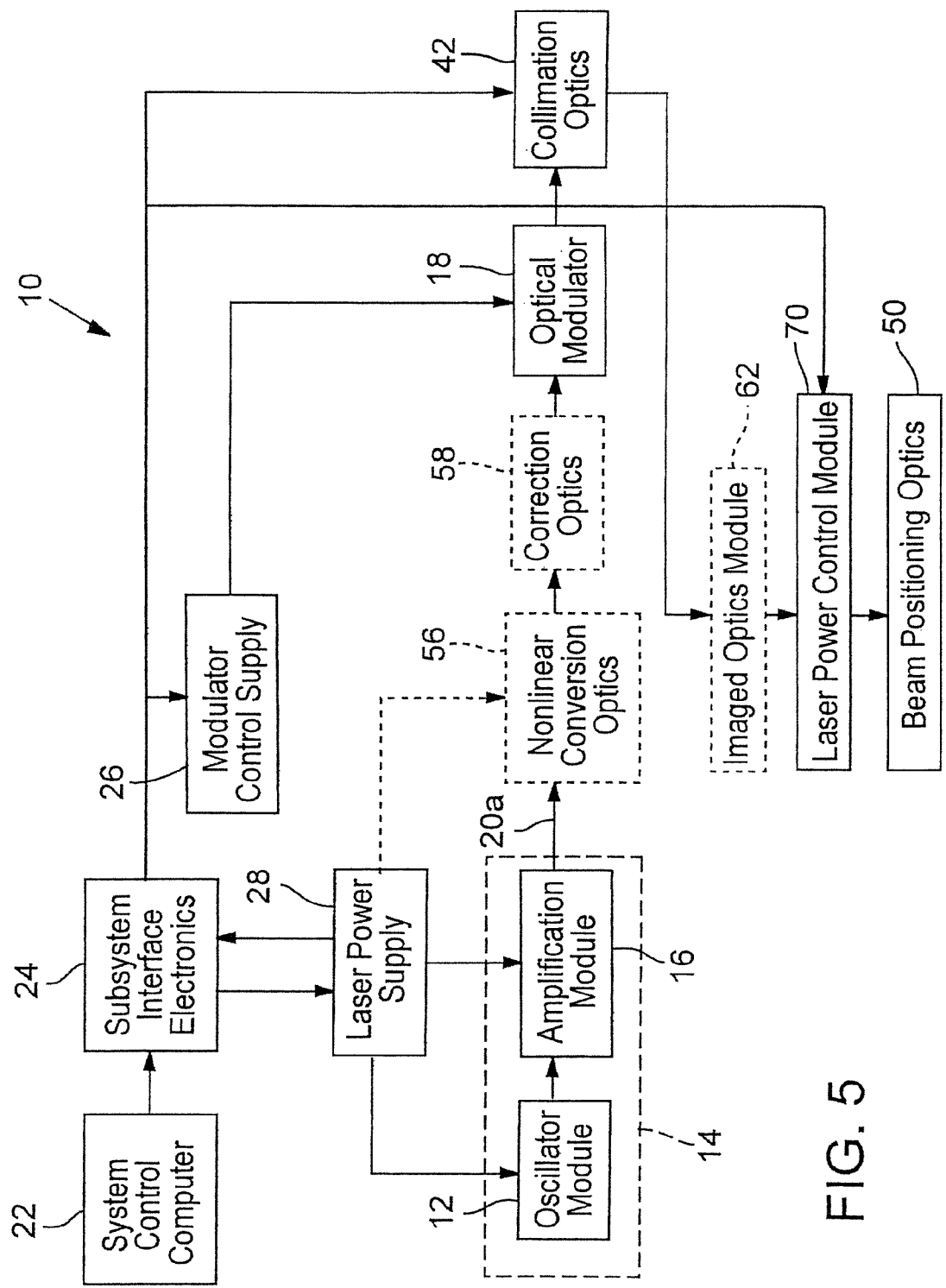
FIG. 5 is a simplified schematic diagram of an exemplary laser system for processing low-k dielectric material supported on a substrate.

FIG. 5 is a simplified schematic diagram of an exemplary laser system 10 for via formation or solder pad cleaning. With reference to FIG. 5, the laser system 10 preferably employs a high-average-power pulsed picosecond laser subsystem 14 that includes a dynamic laser pulse generator or oscillator module 12 and an amplification module 16, such as a DPSS power amplifier.

The dynamic laser pulse generator or oscillator module 12 preferably employs a diode-pumped master oscillator to emit oscillator output pulses having a pulsewidth that is shorter than about 1,000 ps, preferably shorter than about 500 ps, and more preferably shorter than 100 ps, at a wavelength shorter than about 400 nanometers (nm), such as 266 nm, 351 nm, or 355 nm or other conventionally available solid-state or fiber laser UV harmonic wavelengths. The oscillator output pulses are directed into the amplification module 16. The amplification module 16 may be a single-pass, multipass, or regenerative DPSS amplifier. Alternatively, the amplification module 16 may be a diode-pumped rare-earth-doped silica fiber power amplifier. In yet another embodiment, the amplification module 16 may be a diode-pumped, rare-earth-doped silica photonic crystal fiber power amplifier.

The oscillator module 12 and the amplification module 16 preferably employ Nd-doped lasants as gain materials. A preferred Nd-doped lasant is $Nd:GdVO_4$, but alternative Nd-doped lasants include, but are not limited to, $Nd:YVO_4$, Nd:YLF, Nd:glass, and Nd:YAG. The oscillator module 12 and the amplification module 16 may comprise the same or different lasants with the same or different doping concentrations. The oscillator module 12 and the amplification module 16 also preferably employ frequency-selecting elements, prisms, filters, etalons, and/or other elements well known to skilled practitioners to preferentially produce gain at the desired wavelength.

In an exemplary embodiment, an external optical modulator 18, such as an acousto-optic modulator (AOM) or an electro-optic modulator (EOM), can be triggered to provide laser output 20a that may contain a single pulse, multiple independently triggered pulses, or bursts of pulses selected from a pulse train emitted from the amplification module 16 of the picosecond laser subsystem 14. The laser pulses of the laser output 20a have high average power. The optical modulator 18 may be triggered directly or indirectly by a system control computer 22, subsystem interface electronics 24, and/or a modulator control supply 26 as known to skilled practitioners. The trigger timing may be coordinated, if desirable, with the control of a laser power supply 28 directly or indirectly by the system control computer 22 and/or the subsystem interface electronics 24. Skilled persons will appreciate that useful AOM modulation techniques are disclosed in U.S. Pat. No. 7,019,891 of Johnson and can be employed in many embodiments. U.S. Pat. No. 7,019,891 is herein incorporated by reference.

In another exemplary embodiment, the oscillator module 12 may comprise a pulsed semiconductor laser emitting picosecond pulses. In another exemplary embodiment, the oscillator module 12 may comprise a pulsed fiber master oscillator. An exemplary pulsed fiber master oscillator may be a diode-pumped, Nd-doped or Yb-doped silica fiber master oscillator employing a SESAM. Skilled persons will appreciate that other rare-earth-doped fibers may alternatively be employed and that other mode-locking elements may alternatively be employed.

In another exemplary embodiment, the amplification module 16 may be a diode-pumped, Yb-doped silica fiber master amplifier. In yet another exemplary embodiment, the amplification module 16 may be a diode-pumped, Nd-doped silica fiber power amplifier. Skilled persons will appreciate that other rare-earth-doped fibers may alternatively be employed for the amplification module 16. Skilled persons will appreciate that fibers employing step index profiles, step index profiles incorporating polarization maintaining elements, or air gap profiles may be employed.

With reference to FIG. 6, the laser output 20*a* is optionally passed through a variety of well-known expansion and/or collimation optics 42, propagated along an optical path 20, and directed by a beam-positioning system 30 to impinge laser system output pulse(s) 32 on a desired laser target position 34 on a workpiece 52 such as a PWB. An exemplary beam-positioning system 30 may include a translation stage positioner that may employ at least two transverse stages 36 and 38 that support, for example, X, Y, and/or Z positioning mirrors 44 and permit quick movement between the target positions 34 on the same or different workpieces 52.

In an exemplary embodiment, the translation stage positioner is a split-axis system in which a Y stage 36, typically moved by linear motors along rails 46, supports and moves the workpiece 52, and an X stage 38, typically moved by linear motors along rails 48, supports and moves beam-positioning optics such as a fast positioner 50 and associated focusing lens(es) and/or other optics. The Z dimension between the X stage 38 and the Y stage 36 may also be adjustable. The positioning mirrors 44 align the optical path 20 through any turns between the laser subsystem 14 and the fast positioner 50, which is positioned along the optical path 20. The fast positioner 50 may, for example, employ high-resolution linear motors, one or more galvanometer mirrors, fast-steering mirrors, and/or acousto-optic steering techniques that can effect unique or repetitive processing operations based on provided test or design data. The Y and X stages 36 and 38 and the fast positioner 50 can be controlled and moved independently or coordinated to move together in response to panelized or unpanelized data.

The fast positioner 50 may also include or be associated with a vision system that can be aligned to one or more fiducials on the surface of the workpiece 52. The beam-positioning system 30 can employ conventional vision or beam-to-work alignment systems that work through a shared objective lens, or off-axis, with a separate camera, and that are well known to skilled practitioners. In one embodiment, an HRVX vision box employing Freedom Library software in a beam-positioning system 30 sold by Electro Scientific Industries, Inc. of Portland, Oreg. is employed to perform alignment between the laser subsystem 14 and the target positions 34 on the workpiece 52. Other suitable alignment systems are commercially available. An exemplary alignment system may employ bright-field, on-axis illumination, particularly for specularly reflecting workpieces such as lapped or polished wafers, but dark-field illumination or a combination of dark-field illumination and bright-field illumination may be employed. In addition, the beam-positioning system 30 may also employ an Abbe error-correction system such as that described in detail in U.S. Pat. No. 6,430,465 of Cutler, the relevant portions of which are herein incorporated by reference.

Many variations of the beam-positioning system 30 are well known to skilled practitioners, and some embodiments of the beam-positioning system 30 are described in detail in U.S. Pat. No. 5,751,585 of Cutler et al. The ESI Model 2700 or 5320 micromachining systems available from Electro Scientific Industries, Inc. of Portland, Oreg. are exemplary implementations of the beam-positioning system 30. Other exemplary positioning systems, such as model series numbers 27xx, 43xx, 44xx, or 53xx, 55xx, 56xx, manufactured by Electro Scientific Industries, Inc. of Portland, Oreg. can also be employed. Those skilled in the art will recognize that the positioning system can be programmed to utilize toolpath files that will dynamically position at high speeds the laser system output pulses 32 to produce a wide variety of useful via drilling patterns, which may be either periodic or nonperiodic. Skilled persons will also appreciate that AOM beam-steering techniques disclosed in U.S. Pat. No. 7,019,891 can be used in combination with or substituted for the fast positioner 50 and/or the beam-positioning system 30.

The laser output 20*a* may also be directed through additional conventional system optical elements that may include, but are not limited to, nonlinear conversion optics 56, optional correction optics 58, and/or optional imaged optics module 62, which may be employed to control the output power and shape the beam profile of the laser pulses received at the target or workpiece surface. Harmonic conversion techniques employing conventional nonlinear conversion optics 56 to convert a common fundamental wavelength to a second, third, fourth, or fifth harmonic wavelength are well known to skilled practitioners.

With reference to FIG. 7, the optional imaged optics module 62 may include an optical element 64, a lens 66, and an aperture mask 68 placed at or near the beam waist created by the optical element 64 to block any undesirable side lobes and peripheral portions of the beam so that a precisely shaped spot profile is subsequently imaged onto the work surface. In an exemplary embodiment, the optical element 64 is a diffractive device or lens, and the lens 66 is a collimating lens to add flexibility to the configuration of the laser system 10.

Varying the size of the aperture to match the properties of the optical element 64 can control the edge sharpness of the spot profile to produce a size-specified, sharper-edged intensity profile that should enhance the alignment accuracy. In addition, with this arrangement, the shape of the aperture can be precisely circular or can be changed to rectangular, elliptical, or other noncircular shapes that can be aligned parallel or perpendicular to a cutting direction. The aperture mask 68 may optionally be flared outwardly at its light-exiting side. For UV laser applications, the aperture mask 68 in the imaged optics module 62 preferably comprises sapphire. Skilled persons will appreciate that the aperture mask 68 can be used without the optical element 64 and the lens 66.

In an alternative embodiment, optical element 64 includes one or more beam-shaping components that convert laser pulses having a raw Gaussian irradiance profile into shaped (and focused) pulses that have a near-uniform "top hat" profile, or particularly a super-Gaussian irradiance profile, in proximity to the aperture mask 68 downstream of the optical element 64. Such beam-shaping components may include aspheric optics or diffractive optics. In one embodiment, the lens 66 comprises imaging optics useful for controlling beam size and divergence. Skilled persons will appreciate that a single imaging lens component or multiple lens components could be employed. Skilled persons will also appreciate, and it is preferred, that shaped laser output can be employed without using the aperture mask 68.

In one embodiment, the beam-shaping components include a diffractive optic element (DOE) that can perform complex beam shaping with high efficiency and accuracy. The beam-shaping components not only transform the Gaussian irradiance profile to a near-uniform irradiance profile, but they also focus the shaped output to a determinable or specified spot size. Although a single-element DOE is preferred, skilled persons will appreciate that the DOE may include multiple separate elements such as the phase plate, and transform elements disclosed in U.S. Pat. No. 5,864,430 of Dickey et al., which also discloses techniques for designing DOEs for the purpose of beam shaping. The shaping and imaging techniques discussed above are described in detail in U.S. Pat. No. 6,433,301, the relevant portions of which are herein incorporated by reference.

A laser power control module 70 may be employed to achieve laser pulse power control by using modulation methods including, but not limited to, diode pump modulation or external modulation (such as with an external laser power controller 60, including, but not limited to, AOMs or EOMs or motorized polarization rotation optics positioned along the optical path 20) or a combination thereof. In addition, one or more beam-detection devices 54, such as photodiodes, may be downstream of the laser power controller 60, such as aligned with a positioning mirror 44 that is adapted to be partly transmissive to the wavelength of the laser output 20a. The beam-detection optics and electronics may be associated directly or indirectly with the laser power control module 70, and/or may be directly or indirectly in communication with the system control computer 22 and/or the subsystem interface electronics 24, and/or may be used to sample modulated laser output 20a and generate correction signals to the modulators and/or other system optical elements to produce stable modulated output having parameters desirable for processing the workpiece 52. Conventional power-control techniques are known to skilled practitioners. Some exemplary AOM power-control techniques are disclosed in U.S. Pat. No. 7,019,891.

Preferred pulse repetition frequencies employed range from 50 kHz to 10 megahertz (MHz). In many cases, pulse repetition frequencies smaller than 1 MHz are preferred. Certain applications may, however, employ pulse repetition frequencies in the range from 10 MHz to 100 MHz. Typical focused spot sizes employed range from 10 μm to 100 μm. Certain applications may, however, employ spot sizes in the range from 1.5 μm to 10 μm.

Skilled persons will appreciate that the laser parameters employed for pad cleaning may also be used for bulk processing. Alternatively, the laser parameters for pad cleaning may be different from those used for bulk cleaning. In some embodiments, the fluence employed for bulk removal is maintained at about the value for pad cleaning, but the pulsewidth for pad cleaning is changed (significantly decreased) to decrease the number of pulses and decrease the amount of time employed for pad cleaning. Other laser parameters may be changed as well between the bulk processing and pad cleaning steps. Such parameters may include, but are not limited to, wavelength, energy per pulse, repetition rate, or spot size.

Furthermore, skilled persons may recall that U.S. Pat. No. 5,841,099 of Owen et al. and U.S. Pat. No. 6,407,363 of Dunsky et al., which are herein incorporated by reference, disclose techniques for two-step, single-pass processing of blind and through-hole vias by employing a first set of laser parameters to process an overlying metal layer and a second set of laser parameters to process the bulk material. In particular, U.S. Pat. No. 5,841,099 of Owen et al. discloses changing (increasing) the repetition rate and/or changing (increasing) the spot size after processing the overlying metal layer so that the bulk material effectively receives less energy per pulse than the overlying metal layer.

Similarly, U.S. Pat. No. 6,407,363 of Dunsky et al. discloses focus- and spot-size-changing techniques employed to control the irradiance used to form the via in order to enhance via quality as well as to provide a single-pass, two-step method for processing the metal layer and then processing the bulk material. Such techniques can be accomplished with the use of a deformable mirror, but may also be accomplished with the use of an AOM.

Skilled persons will appreciate that the techniques disclosed may be employed to implement a three-step via drilling process such that different laser parameters are employed to process the overlying metal layer, to remove the bulk material, and to clean the pad. For example, the metal layer may be processed at a first set of parameters, the repetition rate and/or spot size may be changed after the metal layer is removed to provide a second set of parameters, and then the pulsewidth may be decreased to provide a third set of parameters for cleaning the pad material. Additionally, different wavelengths may be used for any of the steps. These changes may be implemented in a single laser or by two or more lasers.

Skilled persons will appreciate that the pad cleaning parameters need not be constrained by typical fluence threshold limitations, because removal of a small amount of the underlying metal layer is acceptable and may be desirable to ensure that the pad surface is completely clean.

Skilled persons will also appreciate that the bulk material removal and the pad-cleaning process may employ outward- or inward-spiraling or concentric-circle processing techniques or any variation of loop-profile processing techniques, such as those disclosed in U.S. Pat. No. 6,407,363 of Dunsky et al., whenever the via size or pad size is larger than the spot size. Similarly, trepanning techniques can be employed to create through-holes. For these applications, typical bite sizes may range from about 1 nm to about 15 μm. Typical scanning velocities may range from about 10 to about 1,000 millimeters per second.

As presented in the various embodiments and examples, there are for a variety of laser micromachining applications both throughput and quality benefits for using UV image shaped laser output employing pulses having a pulsewidth in the picosecond regime. In particular, a picosecond pulsewidth solid-state UV laser produces steeper thermal gradients requiring less energy for cleaning the last remaining layer of material, solder mask, or resist material on the target pad. The lower energy put into the target pad results in more efficient processing and less chance of thermal damage for small isolated target pads. For via drilling in or through woven reinforced resin, these laser output parameters can decrease the thermal diffusion of heat into the sidewalls of the via, so sidewall quality is improved. For via drilling through materials with a top metal layer, the picosecond pulsewidth regime can decrease the thermal diffusion of heat into the metal layer and result in better quality cutting and less chance of thermal damage to the metal layer, especially for thin metal layers.

It will be obvious to those having skill in the art that many changes may be made to the details of the above-described embodiments of this invention without departing from the underlying principles thereof. The scope of the present invention should, therefore, be determined only by the following claims.

The invention claimed is:

1. A method for increasing throughput of laser removal of mask material covering a solder pad by minimizing a total number N of pulses used to remove mask material and to expose a surface of solder pad, wherein the total number N of laser pulses includes a bulk number $N_0$ of bulk removal pulses employed to remove bulk solder mask material with a laser removal-bulk material interaction and a bottom surface cleaning number $\delta N$ of surface cleaning pulses employed to clean the surface of the solder pad with a laser cleaning-material interaction, comprising:
generating, from a laser, laser output having a fluence F and including the total number N of laser pulses for removing the bulk solder mask material and for cleaning the surface of the solder pad, wherein at least of the laser pulses has a pulsewidth $\tau$; and
sequentially directing the total number N of laser pulses, wherein $\delta N$ has a relationship to $F/\tau^{1/2}$ and wherein $\delta N/N_0$ is less than or equal to 1, at a target position over a solder pad until a major portion of the mask material covering the solder pad is removed and the surface of the solder pad is operatively clean for a soldering process.

2. The method of claim 1 in which the solder mask material comprises epoxy.

3. The method of claim 1 in which the solder mask material comprises a liquid photoimageable solder mask.

4. The method of claim 1 in which the solder mask material comprises a dry film solder mask.

5. The method of claim 1 in which the laser pulse has a pulsewidth that is shorter than 500 picoseconds.

6. The method of claim 1, further comprising: employing image-shaping optics to shape the laser output.

7. The method of claim 1 in which the laser output is generated by a solid-state laser or a fiber laser.

8. The method of claim 1 in which the laser output is employed in a laser punching process.

9. The method of claim 1 in which the laser output is employed in a laser trepanning, spiraling, or looping process.

10. The method of claim 1 in which the solder pad is operatively clean without solder pad lifting and/or delamination.

11. The method of claim 1 in which $\delta N$ has a relationship to L, where $L=(1/f\tau)^{1/2}-(1/f\tau-1)^{1/2}$.

12. The method of claim 1 in which the laser output has a repetition rate that is less than or equal to 10 megahertz.

13. The method of claim 1 in which the laser output comprises a wavelength of about 355 nanometers or 351 nanometers.

14. The method of claim 1 in which the solder pad comprises an isolated pad.

15. The method of claim 1 in which the laser output is generated by employing an oscillator module for generating oscillator output including at least one oscillator output pulse having a pulsewidth shorter than 1,000 picoseconds and by employing an amplification module for converting the oscillator output to the laser output; and in which the laser output is directed by a beam-positioning system for directing the laser output.

16. The method of claim 1 in which the laser output is directed at the mask material covering different solder pads at temporally different events.

17. The method of claim 1 in which the solder pad is supported by a substrate and the substrate and axis of the laser output are moved relative to each other between cleaning the mask material from different solder pads.

18. The method of claim 1 in which at least one of the laser pulses has a wavelength shorter than 400 nanometers.

19. The method of claim 1 in which at least one of the laser pulses has a pulsewidth t shorter than 1,000 picoseconds.

20. The method of claim 1 in which at least one of the laser pulses has a wavelength shorter than 400 nanometers and a pulsewidth $\tau$ shorter than 1,000 picoseconds.

21. The method of claim 1 in which the removal of the bulk solder mask material creates a hole that has a mask hole diameter, in which the solder pad has a pad diameter that is less than two times the mask hole diameter, and in which the solder pad has a thickness that is less than 18 microns.

22. A method for increasing throughput of laser removal of mask material covering a solder pad, comprising:
selecting laser pulse parameters for minimizing a bottom surface cleaning number $\delta N$ of surface cleaning pulses employed to clean the surface of the solder pad with a laser cleaning-material interaction, wherein a total number N of laser pulses includes a bulk number $N_0$ of bulk removal pulses employed to remove bulk solder mask material with a laser removal-bulk material interaction and the bottom surface cleaning number $\delta N$ of surface cleaning pulses, and wherein the pulse parameters include a wavelength shorter than 400 nanometers and a pulsewidth $\tau$ shorter than 1,000 picoseconds;
generating, from a laser, the total number N of laser pulses for removing the bulk solder mask material and for cleaning the surface of the solder pad, wherein the total number N of laser pulses exhibit the laser pulse parameters selected for minimizing the bottom surface cleaning number $\delta N$ of surface cleaning pulses; and
sequentially directing the total number N of laser pulses at a target position over a solder pad until a major portion of the mask material covering the solder pad is removed and the surface of the solder pad is operatively clean for a soldering process.

* * * * *